(12) United States Patent
Wang

(10) Patent No.: US 6,605,545 B2
(45) Date of Patent: Aug. 12, 2003

(54) METHOD FOR FORMING HYBRID LOW-K FILM STACK TO AVOID THERMAL STRESS EFFECT

(75) Inventor: Chih-Jung Wang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/872,265

(22) Filed: Jun. 1, 2001

(65) Prior Publication Data

US 2002/0182874 A1 Dec. 5, 2002

(51) Int. Cl.[7] .............................................. H01L 21/461
(52) U.S. Cl. ........................ 438/717; 438/723; 438/724; 438/725; 257/752; 257/758; 257/759
(58) Field of Search .................................. 438/623–628, 438/638, 639, 640, 717, 723, 724, 725; 257/752–760

(56) References Cited

U.S. PATENT DOCUMENTS

| | | | | | |
|---|---|---|---|---|---|
| 6,265,780 | B1 | * | 7/2001 | Yew et al. .................... | 257/759 |
| 6,268,294 | B1 | * | 7/2001 | Jang et al. .................... | 438/706 |
| 6,291,887 | B1 | * | 9/2001 | Wang et al. ................... | 257/758 |
| 6,319,809 | B1 | * | 11/2001 | Chang et al. ................ | 438/597 |
| 6,331,479 | B1 | * | 12/2001 | Li et al. ....................... | 438/618 |
| 6,348,407 | B1 | * | 2/2002 | Gupta et al. ................. | 438/637 |
| 6,376,366 | B1 | * | 4/2002 | Lin et al. ..................... | 438/637 |
| 6,472,306 | B1 | * | 10/2002 | Lee et al. ..................... | 438/623 |

* cited by examiner

Primary Examiner—Benjamin L. Utech
Assistant Examiner—Duy-Vu Deo

(57) ABSTRACT

A method for forming hybrid low-k film stack is disclosed, in which an organic spin-on low-k material and CVD low-k material are combined to avoid thermal stress effect. This invention also provides a method for applying hybrid low-k film stack to dual damascene process.

17 Claims, 8 Drawing Sheets

METHOD FOR FORMING HYBRID LOW-K FILM STACK TO AVOID THERMAL STRESS EFFECT

BACKGROUND OF THE INVENTION

1. Field of the Invention

The present invention generally relates to a method for forming a semiconductor device, and more particularly to a method for forming a hybrid low-k film stack to avoid the thermal stress effect.

2. Description of the Prior Art

It is the nature of semiconductor physics that as the feature sizes are scaled down, the performance of internal devices, such as device speed, as well as the functional capability improves. The overall circuit speed, however, becomes more dependent upon the propagation speed of the signals along the interconnects that connect the various devices together. With the advent of very and ultra large scale integration (VLSI and ULSI) circuits, it has therefore become even more important that the metal conductors that form the interconnections between devices as well as between circuits in a semiconductor have low resistivity for high signal propagation. Copper is often preferred for its low resistivity, as well as for resistance to electromigration and stress voiding properties.

In the manufacture of devices on a semiconductor wafer, it is now the practice to fabricate multiple levels of conductive (typically metal) layers above a substrate. The multiple metallization layers are employed in order to accommodate higher densities as device dimensions shrink well below one micron design rules. Likewise, the size of interconnect structures will also need to be shrunk, in order to accommodate the smaller dimensions. Thus, as integrated circuit technology advances into the sub-0.25 micron range, more advanced interconnect architecture and new materials are required.

Low dielectric constant materials have the advantage that higher performance IC devices may be manufactured with minimal increases in chip size. The reduced capacitance given by these materials permits shrinking spacing between metal lines to below 0.25 μm and the ability to decease the number of levels of metal in a device. The technologies being considered for low-k applications are CVD or spin-on of inorganic or organic polymeric materials. More recent advances in Si—O based polymer chemistry have seen the development of new materials that have k=2.5–3.0 by changing the structure of the polymer.

Low-k material is popularly used to improve integrated circuit performance of RC delay below 0.18 micron technology. However, thermal stress effect impacts severely on these low-k materials, especially on organic spin-on material, for instance SiLK. On the other hand, chemical vapor deposition low-k materials have better thermal conduction than organic spin-on materials. Therefore, the inevitable combination of these two materials beyond 0.13 generation is the most critical point in semiconductor processes.

For the foregoing reasons, there is a necessary for a method for forming a hybrid low-k film stack to avoid the thermal stress effect to reduce the thermal stress effect issue.

SUMMARY OF THE INVENTION

In accordance with the present invention, a method is provided for forming a hybrid low-k film stack to avoid the thermal stress effect that substantially can be used to decrease thermal stress in a conventional process.

One object of the present invention is to provide a method for forming a hybrid low-k film stack to avoid the thermal stress effect to apply below 0.13 micron process.

Another object of the present invention is to provide a method for forming hybrid low-k film stack to avoid thermal stress effect to apply below 0.13 micron process.

In order to achieve the above objects, the present invention provides a method for forming a hybrid low-k film stack, in which an organic spin-on low-k material and CVD low-k material are combined to avoid the thermal stress effect. This invention also provides a method for applying a hybrid low-k film stack to a dual damascene process.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

FIG. 1A to FIG. 1H are cross-sectional views of a method flow for forming a hybrid low-k film stack to avoid the thermal stress effect in accordance with one preferred embodiment of the present invention.

Figure 1A:
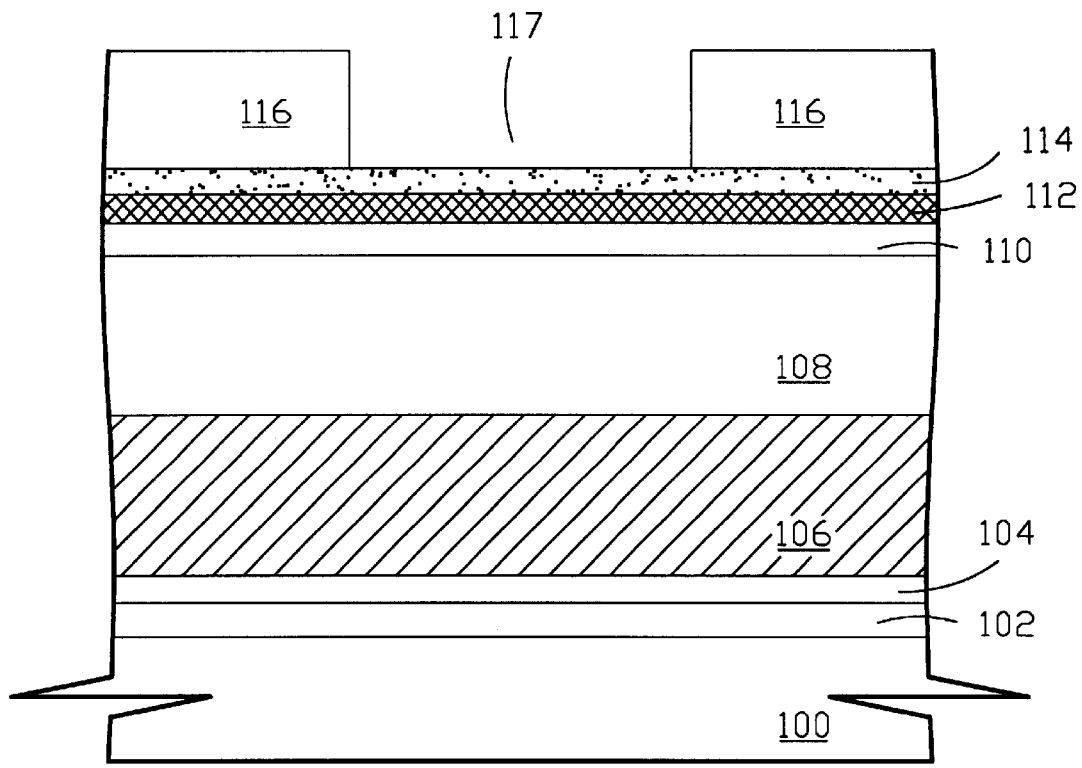
FIG. 1A to FIG. 1H are cross-sectional views of a method for forming a hybrid low-k film stack to avoid the thermal stress effect on a via in accordance with one preferred embodiment of the present invention.

Referring to FIG. 1A, firstly, a semiconductor substrate 100 is provided, and a metal layer 102 is formed over a semiconductor substrate 100. The metal layer 102 comprises copper. Since copper has higher resistance to electromigration and lower electrical resistivity, it is a kind of preferred material for interconnect wiring. Then, a first cap layer 104 is formed over a metal layer 102. The first cap layer 104 comprises silicon nitride. A first dielectric layer 106 is formed on the first cap layer 104 by chemical vapor deposition (CVD). The first dielectric layer 106 comprises of a low-k dielectric, such as Coral, the first dielectric layer 106 has better thermal conduction by chemical vapor deposition. In the embodiment, material of this layer is preferably Coral. The first dielectric layer 106 is typically deposited to a thickness of about 2500 angstroms. A second dielectric layer 108 is formed on the first dielectric layer 106 by spin-on.

The second dielectric layer 108 comprises of a low-k dielectric, such as SiLK and hydrogen silsesquioxane (HSQ), the second dielectric layer 108 has better planarization due to spin-on. In the embodiment, material of this layer is preferably SiLK. The second dielectric layer 108 is typically deposited to a thickness of about 2500 angstroms. The second cap layer 110 comprises silicon nitride (SiN) or silicon carbide (SiC). A first hardmask layer 112 is formed over the second cap layer 110. The first hardmask layer 112 comprises TEOS. Then, a first bottom anti-reflective coating (BARC) layer 114 is formed on the second cap layer 110. A first photoresist layer 116 is deposited on the first bottom anti-reflective coating (BARC) layer 114. The first photoresist layer 116 has a trench opening 117 by using conventional lithographic technology. Then, the bottom anti-reflective coating(BARC) layer 114 is etch by using the first photoresist layer 116 as a mask.

Figure 1B:
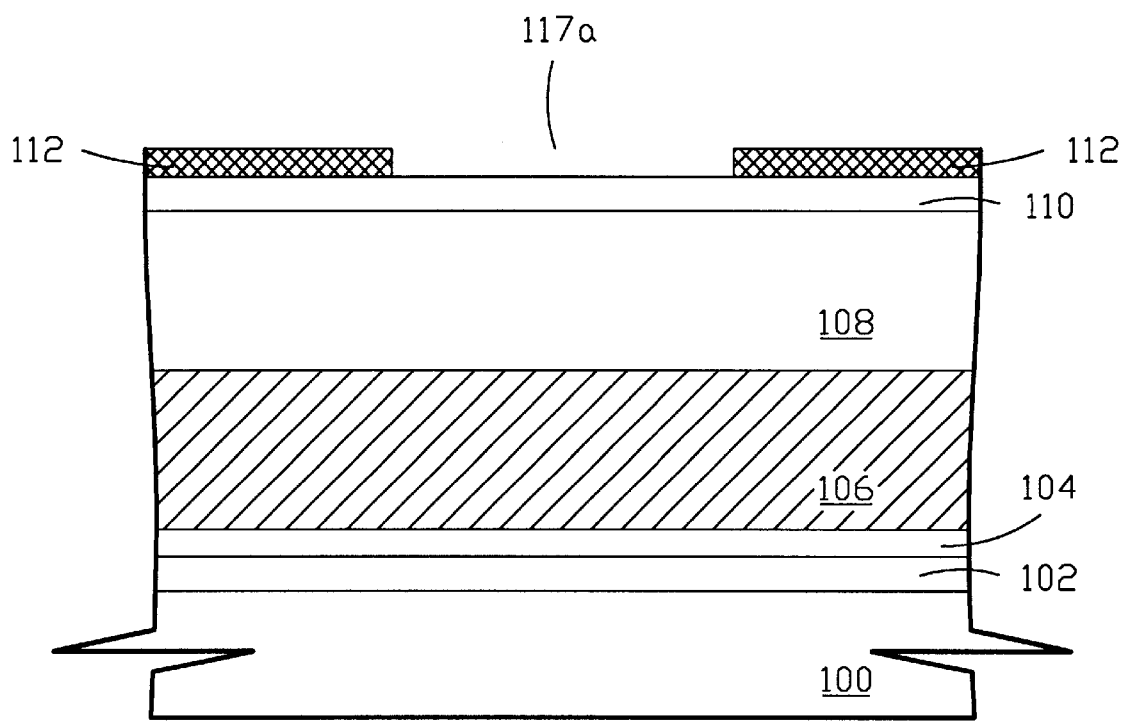

Referring to FIG. 1B, the first hardmask layer 112 has a trench opening 117a using conventional lithographic technology. Then, the second cap layer 110 is etched using the first hardmask layer 112 as a mask. The trench opening 117a is formed by a dry etching method. A first photoresist layer 116 is then removed. Then, the bottom anti-reflective coating (BARC) layer 114 is also removed at the same time.

Figure 1C:
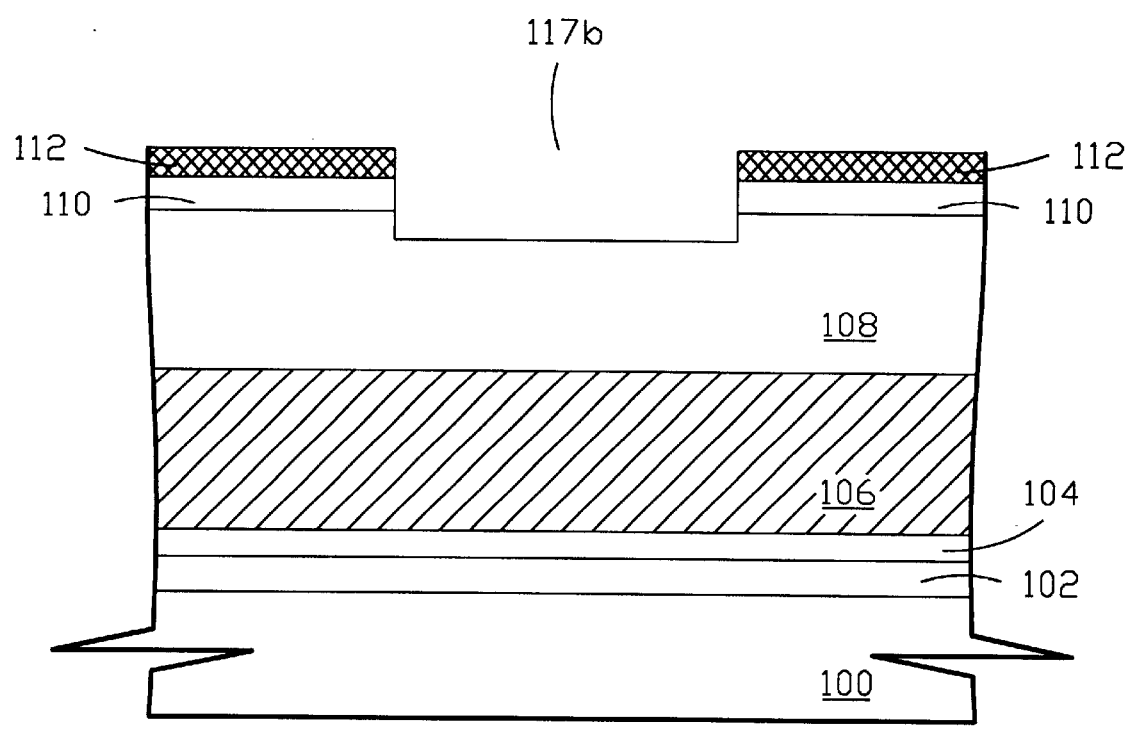

Referring to FIG. 1C, after etching, the second dielectric layer 108 is dished about 300~500 angstroms because the etch selectivity of the second dielectric layer 108 is different from the second cap layer 110. Then, the trench opening 117b is formed by anisotropically etching. The use of CxHyFz, (such as $CHF_3$), $O_2$, and argon as etchants for the second cap layer 110.

Figure 1D:
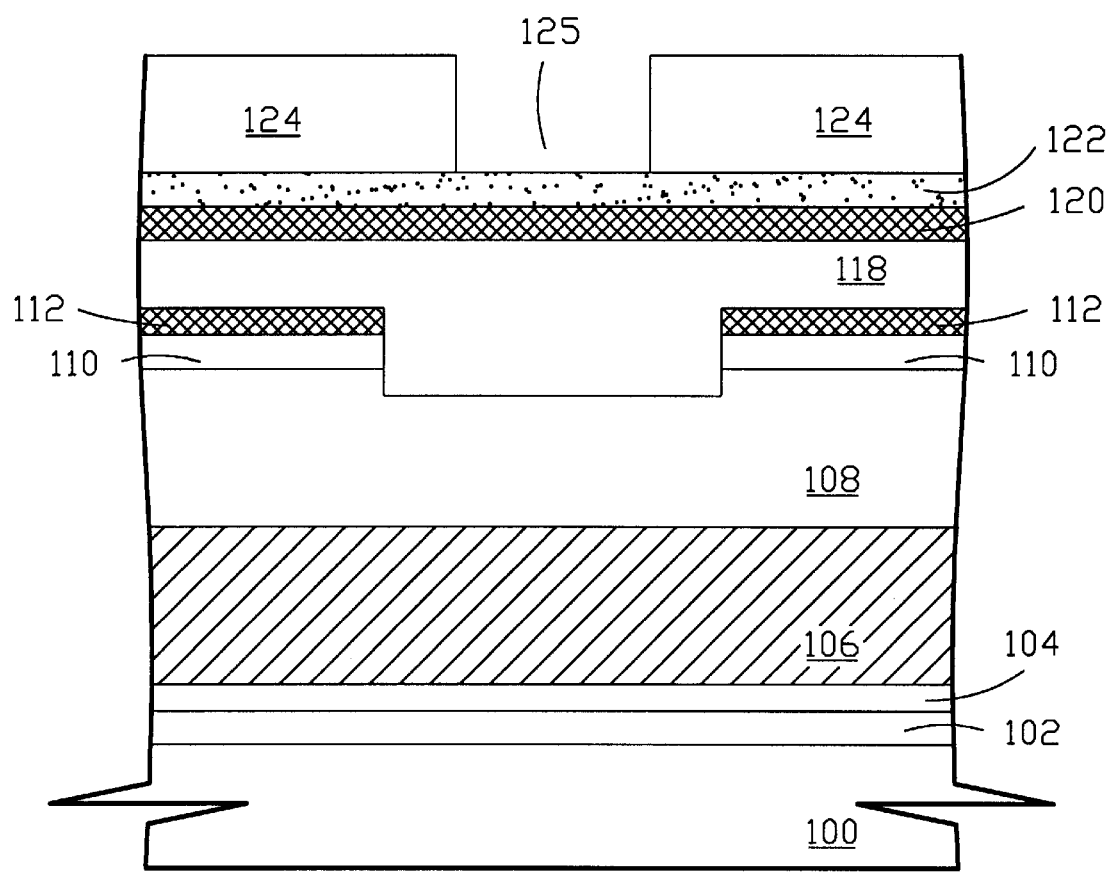

Referring to FIG. 1D, a dielectric layer 118 is formed on the second dielectric layer 108 and filled in the trench opening 117b by spin-on. The dielectric layer 118 is SiLK, and a low-k dielectric. A second hardmask layer 120 is formed over the dielectric layer 118. The second hardmask layer 120 comprises TiN. Then, a second bottom anti-reflective coating (BARC) layer 122 is formed on the second hardmask layer 120. A second photoresist layer 124 is deposited on the second bottom anti-reflective coating (BARC) layer 122. The second photoresist layer 124 has a via opening 125 by using conventional lithographic technology. Then, the bottom anti-reflective coating (BARC) layer 122, the second hardmask layer 120, the SiLK layer 118 and the second dielectric layer 108 are etch by using the second photoresist layer 124 as a mask.

Figure 1E:
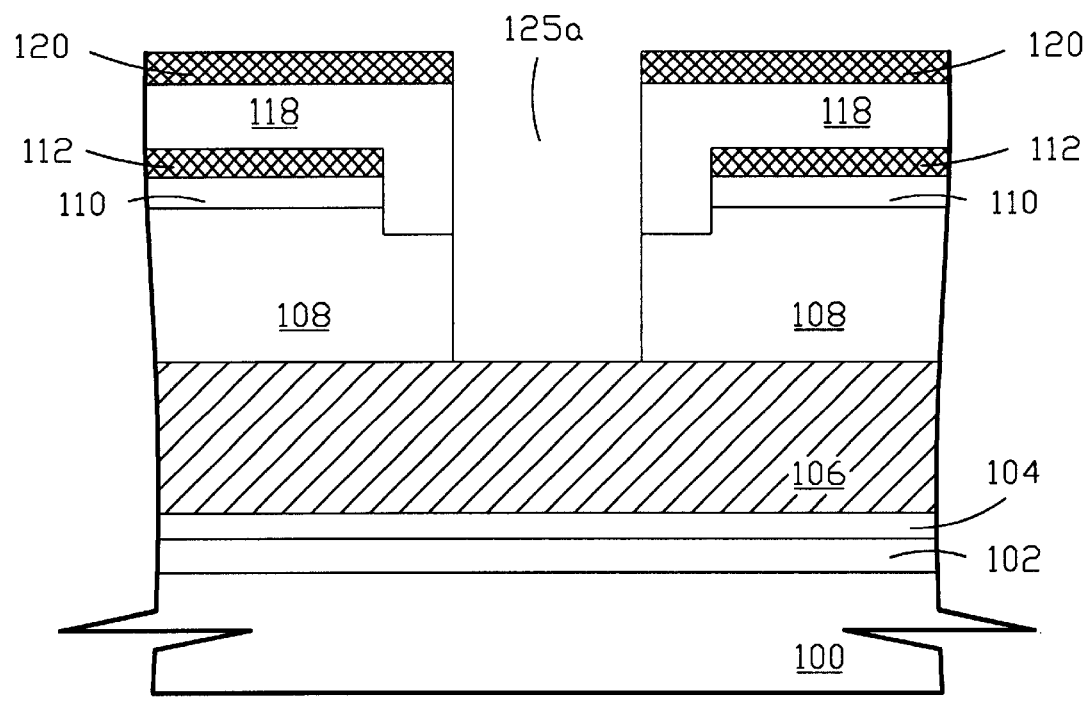

Referring to FIG. 1E, a via opening 125a is formed by dry etching method. Then, a second photoresist layer 124 is then removed. Then, the second bottom anti-reflective coating (BARC) layer 122 is also removed at the same time. The use of CxHyFz, (such as $CHF_3$), $O_2$, and argon as etchants for the second hardmask layer 120. Moreover, the dielectric layer 118 and the second dielectric layer 108 are used of $N_2/H_2$ as etchants.

Figure 1F:
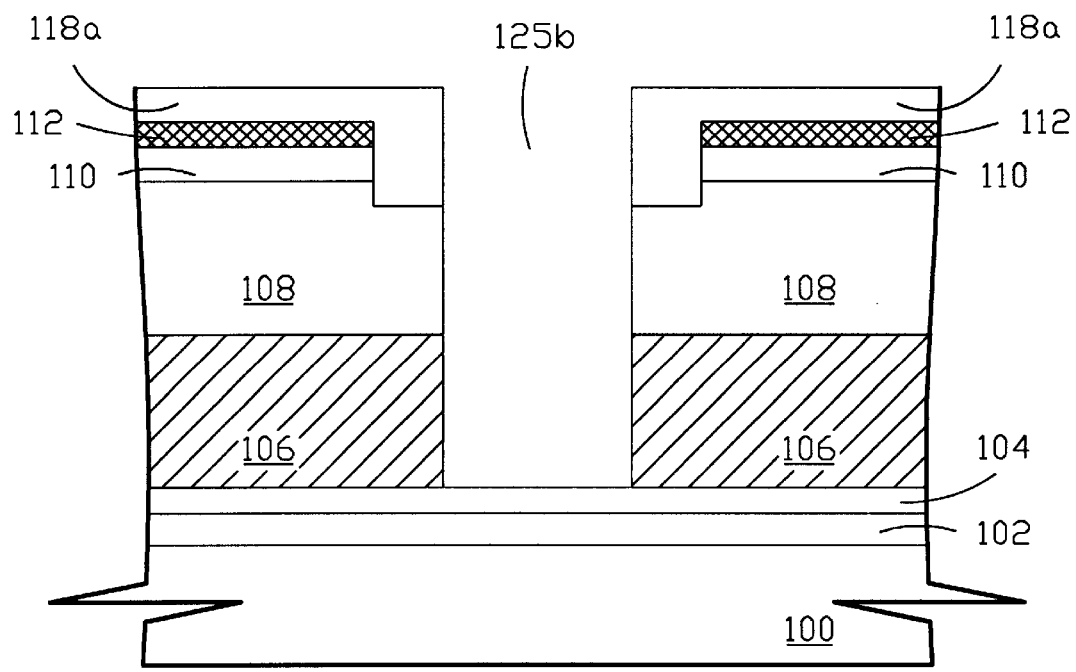

Referring to FIG. 1F, the first dielectric layer 106 on the first cap layer 104 is etched and simultaneously a via opening 125b is formed by using of $N_2$, $C_4F_8$, and argon as etchants. The via opening 125b is formed by anisotropically etching method. The second hardmask layer 120 and a portion of the dielectric layer 118 are removed because the etch selectivity of the first dielectric layer 106 is different from the second hardmask layer 120 and the dielectric layer 118. The portion of the dielectric layer 118 is removed become a dielectric layer 118a.

Figure 1G:
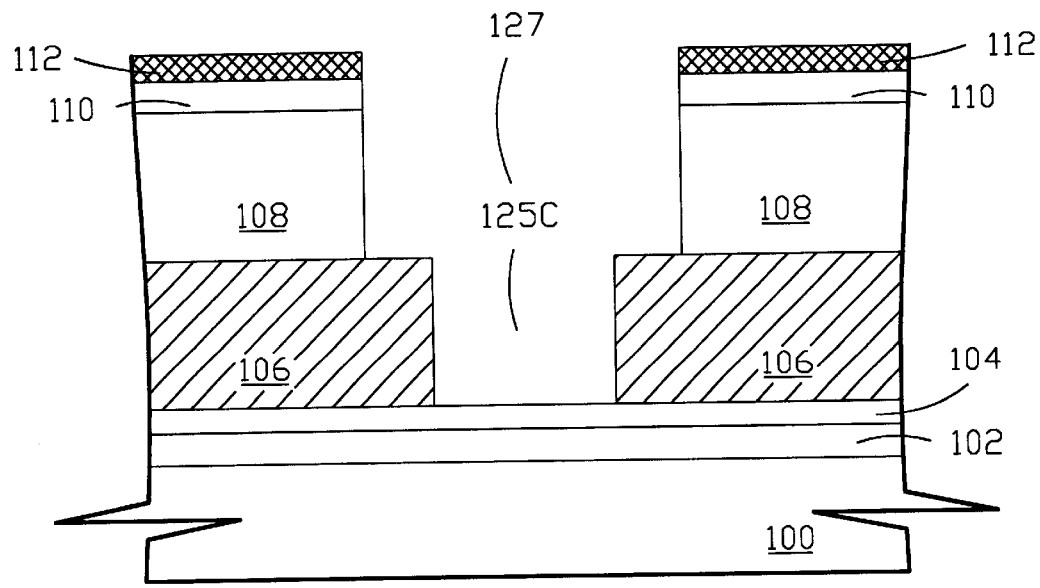

Referring to FIG. 1G, the dielectric layer 118a and the sidewall of the second dielectric layer 108 are etched and simultaneously to form a trench opening 127 stopping on the first dielectric layer 106 using of $N_2/H_2$ as etchants. Then, the first dielectric layer 106 has a via opening 125c. The trench opening 127 is formed by anisotropically etching.

Figure 1H:
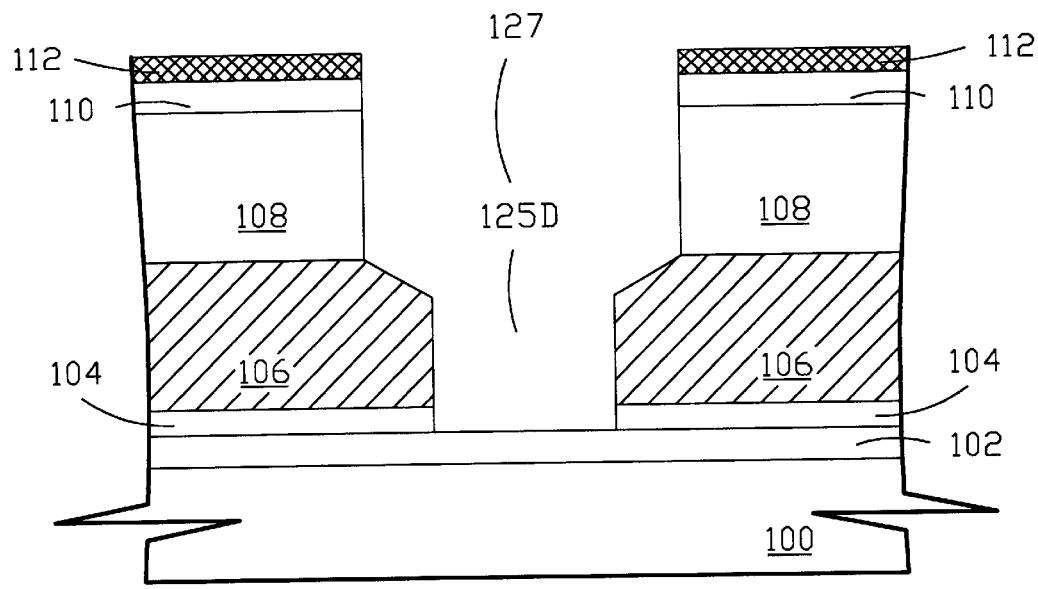

Referring to FIG. 1H, the first cap layer 104 is etched and simultaneously a via opening 125d is formed on the metal layer 102 by using of $N_2$, $C_4F_8$, $O_2$, and argon as etchants. Then, a via opening 125d is formed by dry etching method. The etch process can cause corner on the top rim of the first dielectric layer 106.

FIG. 2A to FIG. 2E are cross-sectional views of a method for forming hybrid a low-k film stack to avoid the thermal stress effect in accordance with another preferred embodiment of the present invention.

Figure 2A:
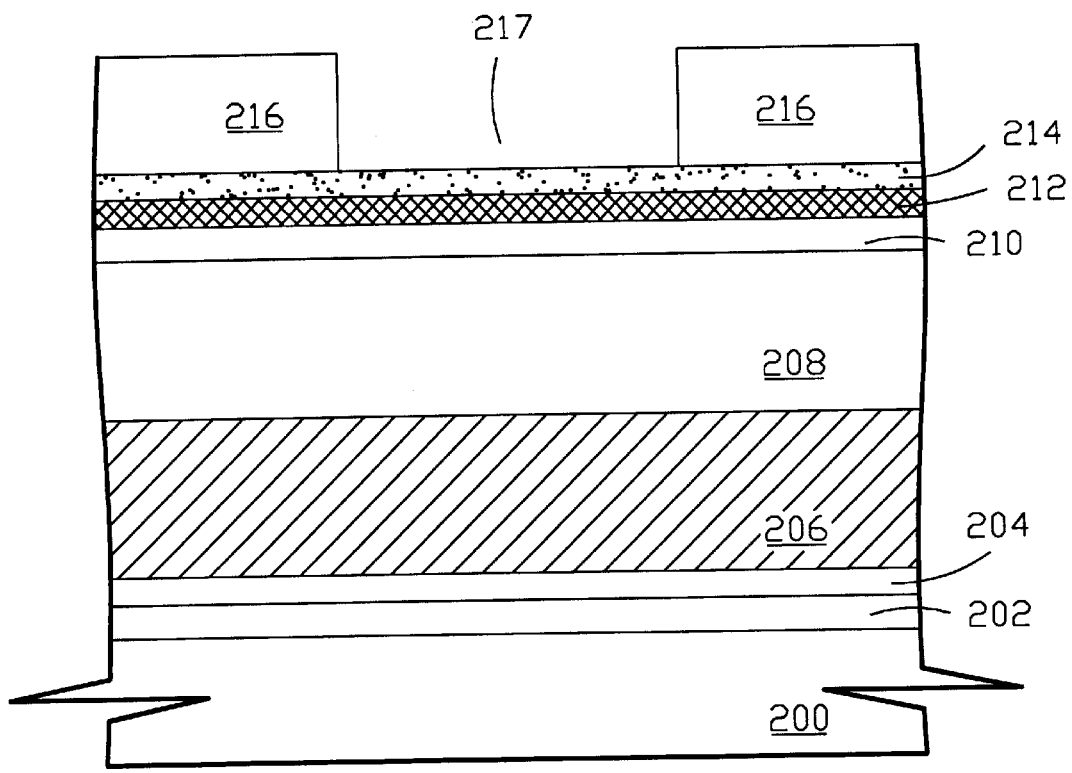
FIG. 2A to FIG. 2E are cross-sectional views of a method for forming a hybrid low-k film stack to avoid the thermal stress effect on a via in accordance with another preferred embodiment of the present invention.

Referring to FIG. 2A, firstly, a semiconductor substrate 100 is provided, and a metal layer 202 is formed over a semiconductor substrate 200. The metal layer 202 comprises copper. Since copper has higher resistance to electromigration and lower electrical resistivity. The copper is preferred material for interconnect wiring. Then, a first cap layer 204 is formed over a metal layer 202. The first cap layer 204 comprises silicon nitride. A first dielectric layer 206 is formed on the first cap layer 204 by chemical vapor deposition (CVD). The first dielectric layer 206 comprises of a low-k dielectric, such as Coral and, the first dielectric layer 206 has better thermal resistance by chemical vapor deposition. In the embodiment, material of this layer is preferably Coral. The first dielectric layer 106 is typically deposited to a thickness of about 2500 angstroms. A second dielectric layer 208 is formed on the first dielectric layer 106 by spin-on. The second dielectric layer 208 comprises of a low-k dielectric, such as SiLK and hydrogen silsesquioxane (HSQ), the second dielectric layer 208 has better planarization by spin-on. In the embodiment, material of this layer is preferably SiLK. The second dielectric layer 208 is typically deposited to a thickness of about 2500 angstroms. The second cap layer 210 comprises silicon nitride (SiN) or silicon carbide (SiC). A first hardmask layer 212 is formed over the second cap layer 210. The first hardmask layer 212 comprises trieothoxysilane (TEOS). Then, a first bottom anti-reflective coating (BARC) layer 214 is formed on the second cap layer 210. A first photoresist layer 216 is deposited on the first bottom anti-reflective coating (BARC) layer 214. The first photoresist layer 216 has a trench opening 217 by using conventional lithographic technology. Then, the first bottom anti-reflective coating (BARC) layer 214 is etch by using the first photoresist layer 216 as a mask.

Figure 2B:
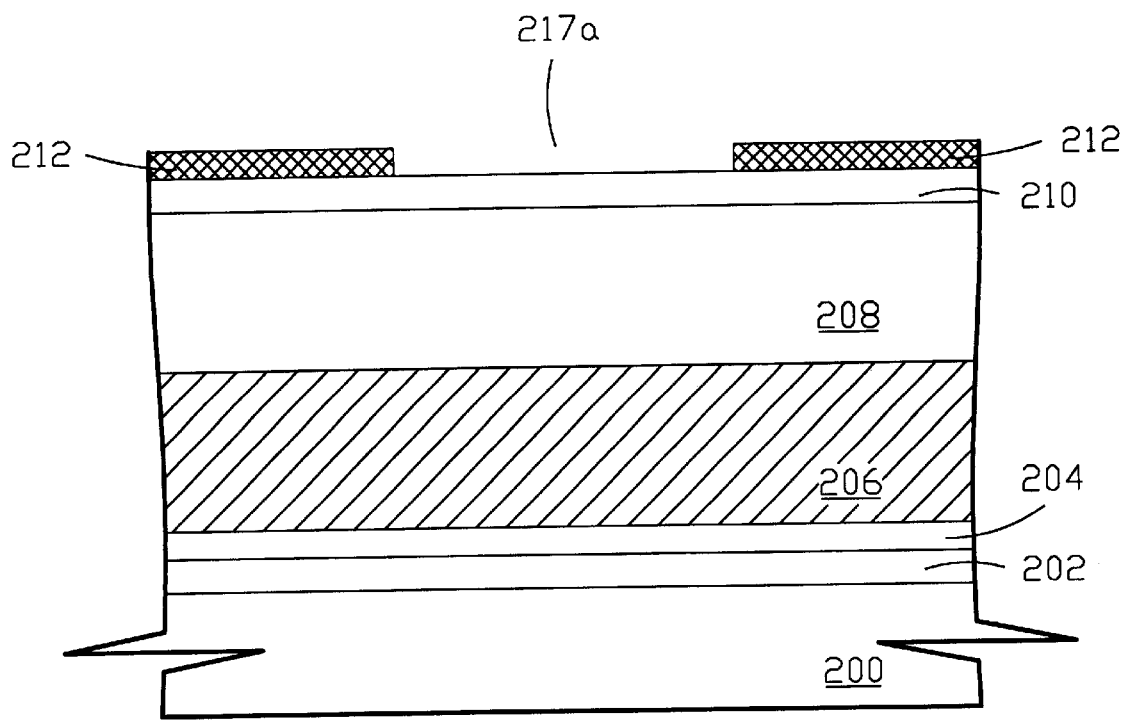

Referring to FIG. 2B, the first hardmask layer 212 has a trench opening 217a that is formed using conventional lithographic technology. Then, the second cap layer 210 is etched using the first hardmask layer 212 as a mask. Then, the trench opening 217a is formed by anisotropically etching first photoresist layer 216 is then removed. Then, the bottom anti-reflective coating (BARC) layer 214 is also removed at the same time.

Figure 2C:
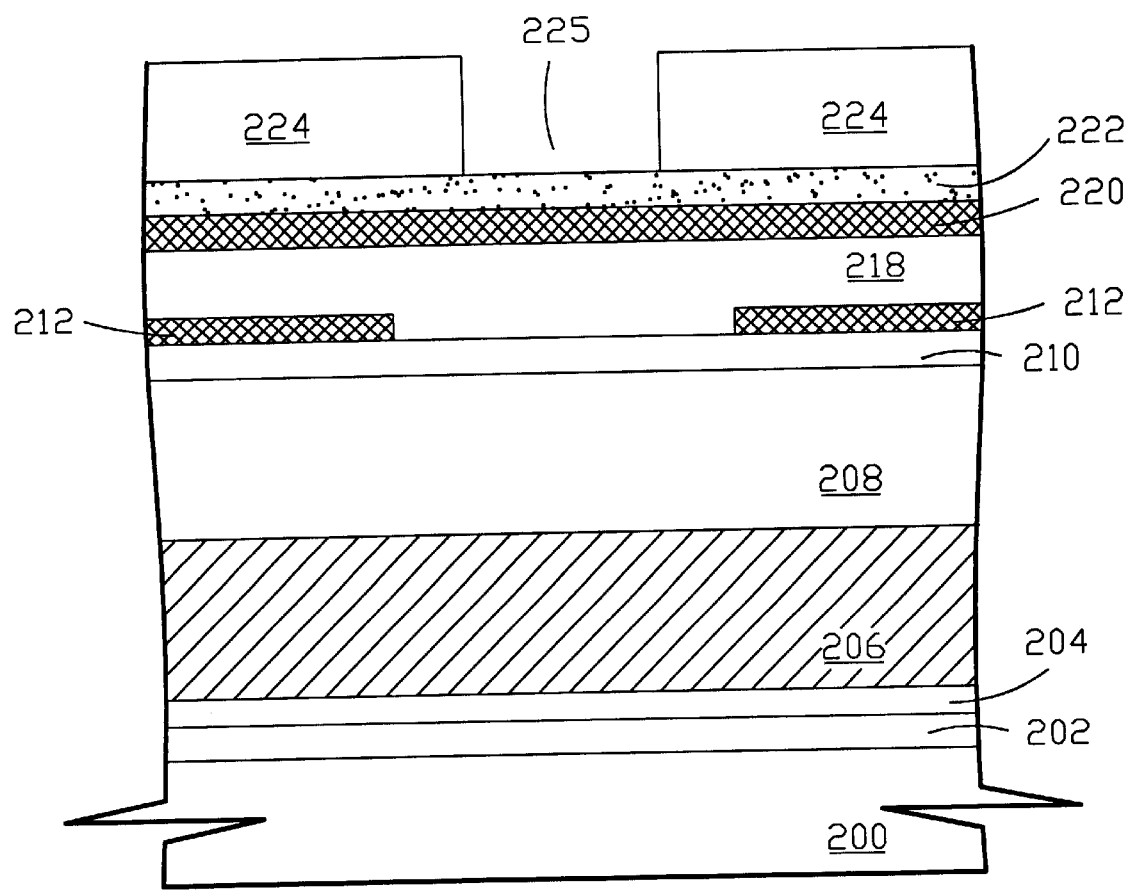

Referring to FIG. 2C, a dielectric layer 218 is formed on the second dielectric layer 208 and filled in the trench opening 217a by spin-on. The dielectric layer 218 is a low-k dielectric material. A second hardmask layer 220 is formed over the SiLK layer 218. The second hardmask layer 220 comprises TiN. Then, a second bottom anti-reflective coating (BARC) layer 222 is formed on the second hardmask layer 220. A second photoresist layer 224 is deposited on the second bottom anti-reflective coating (BARC) layer 222. The second photoresist layer 224 has a via opening 225a by using conventional lithographic technology. Then, the bottom anti-reflective coating (BARC) layer 222, the second hardmask layer 220, the dielectric layer 218, the second dielectric layer 208 and the first dielectric layer 206 are etch by using econd photoresist layer 224 as a mask.

Figure 2D:
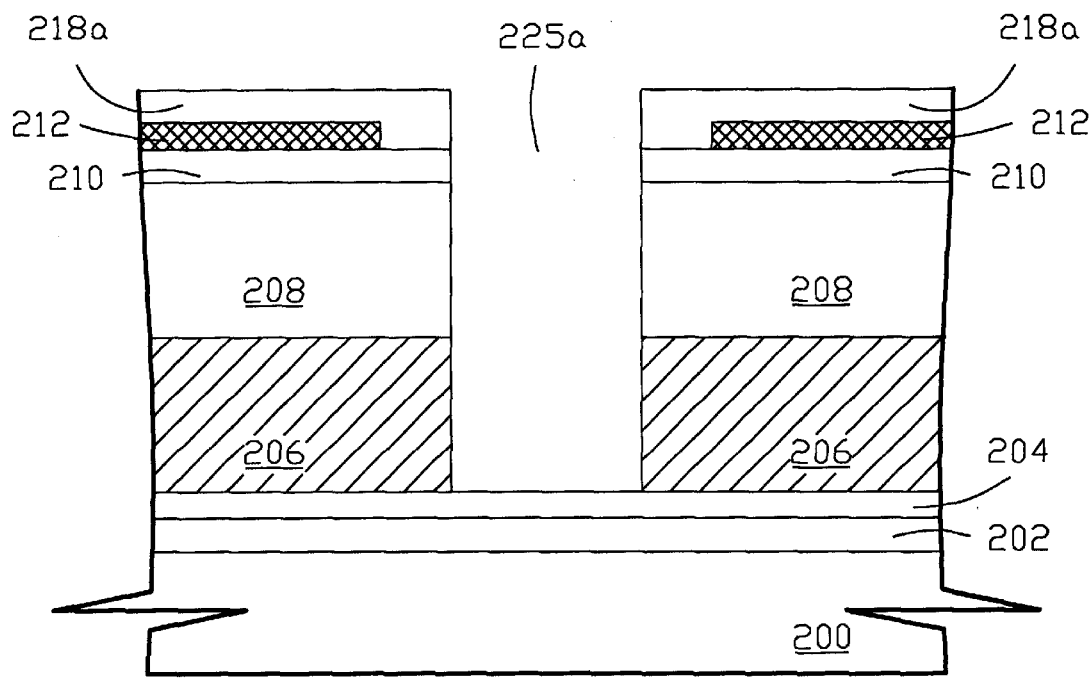

Referring to FIG. 2D, the via opening 225a is formed by dry etching method. Then, a second photoresist layer 224 is removed. Then, the second bottom anti-reflective coating (BARC) layer 222 is also removed at the same time. The use of CxHyFz (such as $CHF_3$), $O_2$, and argon as etchants for the second hardmask layer 220 and the second cap layer 210. The second hardmask layer 220 and a portion of the dielectric layer 218 are removed because the etch selectivity of the dielectric layer 218 is different from the second hardmask layer 220. The portion of the dielectric layer 218 is removed become a dielectric layer 218a. Then, the second dielectric layer 208 is used of $N_2/H_2$ as etchants and the first dielectric layer 206 is used of $N_2$, $C_4F_8$ and Argon as etchants. Then, the dielectric layer 218a, the sidewall of the second cap layer 210 and the second dielectric layer 208 are etched on the first dielectric layer 206. The etch step is through first cap layer 204 stopping on the metal layer 202.

Figure 2E:
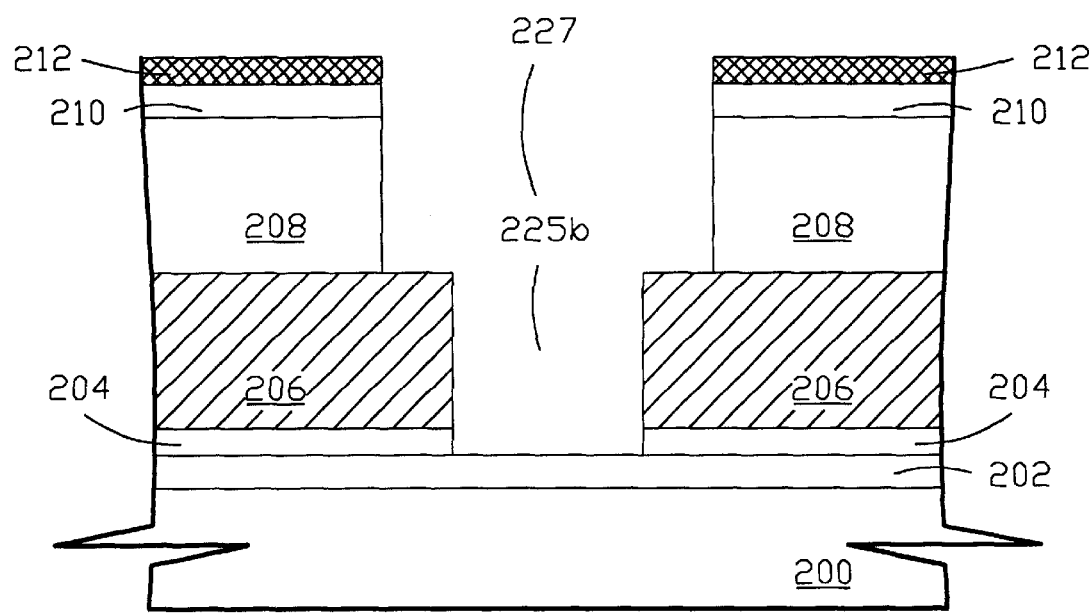

Referring to FIG. 2E, a trench opening 227 is formed on the first dielectric layer 206. The trench opening 227 is formed by anisotropically etching. Then, the first dielectric layer 206 has a via opening 225b, wherein the trench opening 227 is over the via opening 225b. Finally, the surface of the metal layer 202 is cleaned in-situ.

The method for forming a hybrid low-k film stack to avoid the thermal stress effect using the above explained method has the following advantages:

1. The present invention provides a method for forming a hybrid low-k film stack to avoid the thermal stress effect that means combination both SiLK of organic spin-on low-k material and Coral of chemical vapor deposition low-k material to decrease the thermal stress effect.
2. The present invention provides a method for forming hybrid low-k film stack to avoid thermal stress effect that means combination both SiLK of organic spin-on low-k material and Coral of chemical vapor deposition low-k material to apply below 0.13 micron process.

Although specific embodiments have been illustrated and described, it will be obvious to those skilled in the art that various modifications may be made without departing from what is intended to be limited solely by the appended claims.

What is claimed is:

1. A method for applying hybrid low-k film stack to dual damascene process, said method comprising the steps of:
    providing a semiconductor substrate;
    forming a metal layer on said semiconductor substrate;
    forming a first cap layer on said metal layer;
    forming a first low dielectric constant layer on said first cap layer, wherein said first low dielectric constant layer is formed by chemical vapor deposition method;
    forming a second low dielectric constant layer on said first low dielectric constant layer, wherein said second low dielectric constant layer is formed by spin-on method;
    forming a second cap layer on said second low dielectric constant layer;
    forming a first hardmask layer on said second cap layer;
    forming a first bottom anti-reflective coating layer on said first hardmask layer;
    forming a first photoresist layer on said first bottom anti-reflective coating layer, wherein said first photoresist layer having a first trench opening;
    etching said first bottom anti-reflective coating layer and said first hardmask layer by using said first photoresist layer as a first mask such that said pattern is transferred into said first hardmask layer;
    etching said first cap layer and a portion of said second low dielectric constant layer to form a second trench opening, wherein said first cap layer of etch selectivity is different from said second low dielectric constant layer;
    forming a dielectric layer on said first hardmask layer and filling said dielectric layer in said second trench opening;
    forming a second hardmask layer on said dielectric layer;
    forming a second bottom anti-reflective coating layer on said second hardmask layer;
    forming a second photoresist layer on said second bottom anti-reflective coating layer, wherein said second photoresist layer having a first via opening;
    etching said second bottom anti-reflective coating layer, said second hardmask layer, said dielectric layer and said second low dielectric constant layer by using said second photoresist layer as a second mask such that said pattern is transferred into said second low dielectric constant layer;
    etching said first low dielectric constant layer such that said pattern is transferred into said first low dielectric layer;
    etching said dielectric layer to form a third trench opening on said first low dielectric constant layer; and
    etching a first cap layer to form a second via opening on said metal layer.

2. The method according to claim 1, wherein said metal layer comprises copper.

3. The method according to claim 1, wherein said first low dielectric constant layer comprises Coral.

4. The method according to claim 3, wherein said first low dielectric constant layer is selected from the group consisting of $N_2$, $C_4F_8$, and argon etchants.

5. The method according to claim 4, wherein thickness of said first low dielectric constant layer is about 2500 angstrom.

6. The method according to claim 1, wherein said second low dielectric constant layer comprises SiLK.

7. The method according to claim 6, wherein said second low dielectric constant layer is selected from the group consisting of $N_2$ and $H_2$ etchants.

8. The method according to claim 7, wherein thickness of said second low dielectric constant layer is about 2500 angstrom.

9. The method according to claim 1, wherein said etch method is anisotropically etch.

10. A method for applying hybrid low-k film stack to dual damascene process, said method comprising the steps of:
    providing a semiconductor substrate;
    forming a copper metal layer on said semiconductor substrate;
    forming a first cap layer on said copper metal layer;
    forming a first low dielectric constant layer on said first cap layer wherein said first low dielectric constant layer is formed by chemical vapor deposition method;
    forming a second low dielectric constant layer on said first low dielectric constant layer, wherein said second low dielectric constant layer is formed by spin-on method;
    forming a second cap layer on said second low dielectric constant layer;
    forming a first hardmask layer on said second cap layer;

forming a first bottom anti-reflective coating layer on said first hardmask layer;

forming a first photoresist layer on said first bottom anti-reflective coating layer, wherein said first photoresist layer having a first trench opening;

etching said first bottom anti-reflective coating layer and said first hardmask layer by using said first photoresist layer as a first mask such that said pattern is transferred into said first hardmask layer;

forming a dielectric layer on said first hardmask layer and filling said SiLK layer in said second trench opening;

forming a second hardmask layer on said dielectric layer;

forming a second bottom anti-reflective coating layer on said second hardmask layer;

forming a second photoresist layer on said second bottom anti-reflective coating layer, wherein said second photoresist layer having a first via opening;

etching said second bottom anti-reflective coating layer, said second hardmask layer, said dielectric layer and said second low dielectric constant layer by using said second photoresist layer as a second mask such that said pattern is transferred into said second low dielectric constant layer;

etching said first dielectric constant layer such that said pattern is transferred into said first dielectric constant layer;

etching said dielectric layer to form a third trench opening on said first low dielectric constant layer;

etching said sidewall of second low dielectric constant layer to form a forth trench opening on said first low dielectric constant layer; and etching a first cap layer to form a second via opening on said metal layer.

11. The method according to claim 10, wherein said first low dielectric layer comprises Coral.

12. The method according to claim 11, wherein said first low dielectric constant layer is selected from the group consisting of $N_2$, $C_4F_8$, and argon etchants.

13. The method according to claim 12, wherein thickness of said first low dielectric constant layer is about 2500 angstrom.

14. The method according to claim 10, wherein said second low dielectric constant layer comprises SiLK.

15. The method according to claim 14, wherein said second low dielectric constant layer is selected from the group consisting of $N_2$ and $H_2$ etchants.

16. The method according to claim 15, wherein thickness of said second low dielectric constant layer is about 2500 angstrom.

17. The method according to claim 10, wherein said etch method is anisotropically etch.

* * * * *